(12) United States Patent
Geese et al.

(10) Patent No.: US 10,868,987 B2
(45) Date of Patent: Dec. 15, 2020

(54) LIGHT-SENSOR MODULE, METHOD FOR OPERATING A LIGHT-SENSOR MODULE AND METHOD FOR PRODUCING A LIGHT-SENSOR MODULE

(71) Applicant: Robert Bosch GmbH, Stuttgart (DE)

(72) Inventors: Marc Geese, Ostfildern Kemnat (DE); Ulrich Seger, Leonberg-Warmbronn (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/317,369

(22) PCT Filed: Jul. 10, 2017

(86) PCT No.: PCT/EP2017/067223
§ 371 (c)(1),
(2) Date: Jan. 11, 2019

(87) PCT Pub. No.: WO2018/011123
PCT Pub. Date: Jan. 18, 2018

(65) Prior Publication Data
US 2019/0320130 A1    Oct. 17, 2019

(30) Foreign Application Priority Data
Jul. 13, 2016    (DE) .................. 10 2016 212 797

(51) Int. Cl.
*H04N 5/369*        (2011.01)
*H04N 5/378*        (2011.01)
(Continued)

(52) U.S. Cl.
CPC ..... *H04N 5/3696* (2013.01); *H01L 27/14607* (2013.01); *H04N 5/378* (2013.01); *H04N 5/379* (2018.08); *H04N 9/045* (2013.01)

(58) Field of Classification Search
CPC ...... H04N 5/369; H04N 5/3696; H04N 5/376; H04N 5/378; H04N 5/379;
(Continued)

(56) References Cited

U.S. PATENT DOCUMENTS

2005/0248667 A1* 11/2005 Schweng ............. H04N 5/2355
                                                                 348/234
2011/0156197 A1    6/2011 Tivarus et al.
(Continued)

FOREIGN PATENT DOCUMENTS

CN          104241310 A      12/2014
EP            3026892 A1      6/2016
(Continued)

OTHER PUBLICATIONS

International Search Report for PCT/EP2017/067223, dated Oct. 17, 2017.

*Primary Examiner* — Paul M Berardesca
(74) *Attorney, Agent, or Firm* — Norton Rose Fulbright US LLP; Gerard Messina

(57) ABSTRACT

A light sensor module is described. The light sensor module includes a sensor layer having a plurality of sensor cells. The sensor cells each has at least two sensor pixels, each for acquiring a different light property or transfer characteristic. The sensor pixels are configured in columns and rows. In addition, the light sensor module includes a signal processing unit for processing sensor signals of the sensor pixels. The sensor pixels of each column are connected in electrically conductive fashion to the signal processing unit via at least one read line each assigned to a different light property. Likewise, the sensor pixels of each row are connected in electrically conductive fashion to the signal processing unit via at least one selection line. The signal processing unit is designed to select row-by-row, via the selection line, the sensor pixels to be read out via the read line.

17 Claims, 13 Drawing Sheets

(51) Int. Cl.
*H01L 27/146* (2006.01)
*H04N 9/04* (2006.01)

(58) Field of Classification Search
CPC .......................... H04N 9/04551–04561; H01L 27/14603–14607; H01L 27/14634; H01L 27/14636; H01L 27/14638
See application file for complete search history.

(56) References Cited

U.S. PATENT DOCUMENTS

| | | |
|---|---|---|
| 2011/0285713 A1 | 11/2011 | Swic et al. |
| 2012/0307030 A1* | 12/2012 | Blanquart .......... A61B 1/00009 348/76 |
| 2012/0307120 A1 | 12/2012 | Ito et al. |
| 2015/0350575 A1 | 12/2015 | Agranov et al. |
| 2016/0381313 A1* | 12/2016 | Murata .............. H04N 5/35563 348/302 |

FOREIGN PATENT DOCUMENTS

| | | | |
|---|---|---|---|
| JP | H01239974 | * | 9/1989 |
| JP | H01239974 A | | 9/1989 |
| JP | 2008306379 A | | 12/2008 |
| JP | 2009272820 A | | 11/2009 |
| JP | 2015186007 A | | 10/2015 |
| WO | 2014203844 A1 | | 12/2014 |
| WO | 2015111374 A1 | | 7/2015 |

* cited by examiner

Col: 1 2 3 4 5 6 7 8 9 .....
row:

| | | | | | | | | | |
|---|---|---|---|---|---|---|---|---|---|
| 1 | 4 | | 3 | 4 | | 3 | 4 | | 3 |
| 2 | | 5 | | | 5 | | | 5 | 5 |
| 3→ | 2 | | 1 | 2 | | 1 | 2 | | 1 |
| 4 | 4 | | 3 | 4 | | 3 | 4 | | 3 |
| 5 | | 5 | | | 5 | | | 5 | |
| 6 | 2 | | 1 | 2 | | 1 | 2 | | 1 |
| 7 | 4 | | 3 | 4 | | 3 | 4 | | 3 |
| 8 | | 5 | | | 5 | | | 5 | |
| 9 | 2 | | 1 | 2 | | 1 | 2 | | 1 |

— 2201 b)

Col: 1 2 3 4 5 6 7 8 9 .....
row:

| | | | | | | | | | |
|---|---|---|---|---|---|---|---|---|---|
| 1 | 4 | | 3 | 4 | | 3 | 4 | | 3 |
| 2 | | 5 | | | 5 | | | 5 | |
| 3→ | 2 | | 1 | 2 | | 1 | 2 | | 1 |
| 4 | 4 | | 3 | 4 | | 3 | 4 | | 3 |
| 5 | | 5 | | | 5 | | | 5 | |
| 6 | 2 | | 1 | 2 | | 1 | 2 | | 1 |
| 7 | 4 | | 3 | 4 | | 3 | 4 | | 3 |
| 8 | | 5 | | | 5 | | | 5 | |
| 9 | 2 | | 1 | 2 | | 1 | 2 | | 1 |

2202

LIGHT-SENSOR MODULE, METHOD FOR OPERATING A LIGHT-SENSOR MODULE AND METHOD FOR PRODUCING A LIGHT-SENSOR MODULE

FIELD OF THE INVENTION

The present invention is based on a device or a method of the type indicated in the independent claims. The subject matter of the present invention is also a computer program.

BACKGROUND INFORMATION

A light sensor module can be realized as a sensor array made up of a plurality of multichannel macrocells.

SUMMARY

Against this background, the approach presented here provides a light sensor module, a method for operating a light sensor module, a method for producing a light sensor module, and a device that uses at least one of these methods, as well as, finally, a corresponding computer program, according to the main claims. Through the measures stated in the dependent claims, advantageous developments and improvements of the device indicated in the independent claim are possible.

A light sensor module is presented having the following features:

a sensor layer having a plurality of 2-5 different sensor cells, the sensor cells each being designed to acquire a different light property and/or a different change characteristic and/or a different detection volume, the sensor pixels being configured in columns and rows; and a signal processing unit for processing sensor signals of the sensor pixels, the sensor pixels of each column being conducted in electrically conductive fashion to the signal processing unit via at least one read line each assigned to a different light property or change characteristic or transfer characteristic, and the sensor pixels of each row being connected electrically conductive fashion to the signal processing unit via at least one selection line, the signal processing unit being designed to select the sensor pixels row-by-row via the selection line for reading out via the read line.

According to a specific embodiment, the sensor layer has a plurality of sensor cells, the sensor cells each having at least two sensor pixels, according to an exemplary embodiment at least five sensor pixels, each for acquiring a different light property or transfer characteristic or change characteristic, the sensor pixels being configured in columns and rows. It is also conceivable that two or more of the sensor pixels of a sensor cell have the same light property or transfer characteristic or change characteristic, for example in order to acquire it redundantly. The sensor pixels that acquire the same light property or transfer characteristic or change characteristic can for example have different sizes.

A sensor layer can for example be understood as a layer of a semiconductor material or a hybrid layer of organic and semiconductor materials. A sensor cell can for example be understood as a five-channel light-sensitive macrocell, also called a macropixel. A sensor pixel can be understood as an individual element of the sensor cell. For example, the sensor cells can each have one larger main pixel and four smaller additional pixels. The additional pixels can for example be situated symmetrically around the main pixel. Therefore, the additional pixels can also be referred to as satellite cells. According to a specific embodiment, the sensor pixels are also referred to as sensor cells. A light property can for example be understood as a wavelength or color, a polarization, or a temporal intensity curve. The change characteristic can be understood as a linear or logarithmic conversion of the intensity signal into an electrical signal.

The approach presented here is based on the knowledge that through row-by-row selection and column-by-column reading out of sensor pixels of a light sensor module, for example a sensor array configuration for machine vision, a data rate for generating an image signal can be significantly reduced despite high resolution. Moreover, due to the fact that the individual sensor pixels each acquire different light properties, the recognition precision of the light sensor module can be increased.

The measurable light properties reflect the interaction of an illumination with the surfaces of objects in the environment. Particularly suitable characteristics for the classification of objects are in particular polarization and color phenomena, but also an intensity modulation based on the pulsed illumination sources that are increasingly used.

It is therefore particularly advantageous to acquire these characteristics, using a suitable light sensor module such as the subject matter of the approach described here, at the same location with other features, in order in this way to enable association of the totality of different features of an object with this particular object and to simplify the recognition of situations such as a modulated illumination, a wet roadway, or a reflective building façade, or also to simplify the differentiation of objects from their respective background by comparing object features with, for example, a broadband reflectance, a spectral composition of a reflection, or a polarization.

According to a specific embodiment, each of the sensor cells can be fashioned having a main pixel and at least one additional pixel, according to different specific embodiments for example also having two, three, four, five, or six additional pixels, as the sensor pixels. A surface of the main pixel can be larger than a respective surface of an additional pixel. In this way, the efficiency of the light sensor module can be increased. It is also conceivable for the larger surface of the main pixel to be realized by connecting together a plurality of sensor pixels of the same type that have for example the same light property or transfer characteristic or change characteristic. In this interconnection, the individual sensor pixels then act as one large sensor pixel, and are also controlled and read out together. The shape of the sensor pixel can here be selected as desired, for example as a rectangle, circle, or a cross.

If more than one additional pixel is used, the additional pixels can be situated symmetrically around the main pixel. This enables a uniform configuration of the sensor pixels in the sensor layer.

According to a further specific embodiment, the main pixel can be formed as a cross that divides the sensor cell into four quadrants. Here one of the, in this case, four additional pixels can be respectively situated in each of the four quadrants. In this way, the sensor cell can be realized in as space-saving a manner as possible.

It is advantageous if the main pixel is designed to acquire a brightness level, in particular a broadband brightness. In this way, a particularly sensitive brightness acquisition by the light sensor module is enabled.

The light sensor module can have a signal processing layer. Here, the signal processing unit can be situated in the signal processing layer. The signal processing layer and the sensor layer can be combined with one another in a semiconductor technology method ("stacking" or "hybrid bonding") to form a layer composite that is for example mechanically and electrically coupled. In this way, the light sensor module can be miniaturized efficiently and at low cost.

The sensor pixels can be configured in at least one first row and second row. The first row can have a larger number of sensor pixels selectable via the selection line than does the second row.

In addition or alternatively, the sensor pixels can be configured in at least one first column and second column. Here, the first column can have a larger number of sensor pixels that can be read out via the read line than does the second column. In this way, a flexible configuration of the sensor pixels in the sensor layer is enabled.

In addition, the approach described here provides a method for operating a light sensor module according to one of the above specific embodiments, the method including the following steps:

row-by-row selection of sensor pixels via the selection line; and reading out, via the read line, of sensor signals of the sensor pixels selected via the selection line.

According to a specific embodiment, in the step of reading out the sensor signals of the sensor cells are read out essentially simultaneously.

This specific embodiment offers the advantage that the reading out of the sensor signals of a sensor cell can take place without a costly buffering of the sensor signals. As a result, separate storage elements or unnecessary computing capacities are not required. The reading out of an overall sensor row that in turn contains a plurality of sensor cells can take place either with a time offset or approximately simultaneously, depending on the chosen controlling/wiring of the image sensor. The combination of the signals of the individual cells can take place either in the analog domain by interconnecting read lines at a summation point, capacitive coupling at a switched capacitor, or the like. A weighted connecting together through the introduction of controllable gain or offset elements is also possible. Likewise, the combination of the signals after the A/D conversion can take place using a computing device (for accumulation, division, multiplication). "Substantially simultaneously" here means that of course small temporal offsets are also possible that occur during the reading out/sampling of individual sensor signals and are known to those skilled in the art.

In addition, a specific embodiment is conceivable in which a plurality of rows are addressed simultaneously and the sensor pixels of a sensor cell are read out simultaneously; in particular, 3 or 5 rows of the image sensor can be addressed simultaneously. In this way, a buffering can also be omitted.

According to a further specific embodiment, the method can include a step of generating an image signal using the sensor signals. In particular, here the image signal can be generated without buffering of the sensor signals. In this way, the image signal can be generated particularly efficiently.

According to a further specific embodiment of the method, defined pixel groups and/or cell combinations are read out with a time offset. Here, the overall image sensor, or all available sensor pixels, can for example be divided into two or more pixel groups or cell combinations. It is advantageous if the pixel groups or cell groups are able to acquire the same property of the detected radiation, for example a luminance value and/or chrominance value. This can be realized through a corresponding selection of the individual sensor pixels. The time offset between the reading out of the different pixel groups and/or cell combinations can be selected independently of the read-out frequency of the image sensor. The value can be arbitrary in size and can be changed during operation of the image sensor. A separate unit can be provided for this purpose.

In addition, the approach presented here creates a method for producing a light sensor module, the method including the following step:

forming a layer composite of a sensor layer having a plurality of sensor cells, the sensor cells each having at least two sensor pixels for the respective acquisition of a different light property, or having a different change characteristic, the sensor pixels being configured in columns and rows, and a signal processing layer having a signal processing unit for processing the sensor signals of the sensor pixels, the sensor pixels of each column being connected to the signal processing unit in electrically conductive fashion via at least one read line each assigned to a different light property, and the sensor pixels of each row being connected to the signal processing unit in electrically conductive fashion via at least one selection line, the signal processing unit being designed to select row-by-row, via the selection line, the sensor pixels for reading out via the read line.

This method can be implemented for example in software or hardware or in a mixed form of software and hardware, preferably in the processing layer of the sensor module. The processing takes place primarily for the purpose of compressing the information and relieving the burden on the transmission channel to a control device, and for this reason according to a specific embodiment the data are processed in the composite with the sensor layer.

The approach presented here also provides a device that is designed to carry out, control, or realize the steps of a variant of a method presented here in corresponding devices. Through this variant embodiment of the present invention in the form of a device as well, the object of the present invention can be achieved quickly and efficiently.

For this purpose, the device can have at least one computing unit for processing signals or data, at least one storage unit for storing signals or data, at least one interface to a sensor or to an actuator for reading in sensor signals from the sensor or for outputting data signals or control signals to the actuator, and/or at least one communication interface for reading in or outputting data that are embedded in a communication protocol. The computing unit can be for example a signal processor, a microcontroller, or the like, and the storage unit can be a flash memory, an EPROM, or a magnetic storage unit. The communication interface can be designed to read in or output data wirelessly and/or in wire-bound fashion, and a communication interface that can read in or output wire-bound data can for example electrically or optically read in these data from a corresponding data transmission line or output them to a corresponding data transmission line.

In the present context, a device can be understood as an electrical apparatus that processes sensor signals and outputs control signals and/or data signals as a function thereof. The device can have an interface that can be realized as hardware and/or as software. In the case of a realization as hardware, the interfaces can for example be part of a so-called system ASIC that contains a wide variety of functions of the device. However, it is also possible for the interfaces to be separate integrated circuits or to be made up at least partly of discrete components. In the case of a realization as software, the interfaces can be software modules present for example on a microcontroller alongside other software modules.

Also advantageous is a computer program product or computer program having program code that can be stored on a machine-readable carrier or storage medium such as a semiconductor memory, a hard drive storage device, or an optical storage device, and that is used to carry out, realize, and/or control the steps of the method according to one of the specific embodiments described above, in particular when the program product or program is executed on a computer or on a device.

According to a specific embodiment, a compression of information takes place in the sensor module (=composite of sensor layer and signal processing layer). This is typically done using a µC, DSP, or a programmable, trainable, or self-learning neural network. The elements or components provided for the compression are also called connective networks. The quantity of data is reduced, and individual features (e.g. the polarization) are to be transmitted in coded fashion. In this way, the method steps can also be distributed with the software to a connected system computer.

BRIEF DESCRIPTION OF THE DRAWINGS

FIG. 21 shows another read-out schema of the light sensor module.

FIG. 22 shows another read-out schema of the light sensor module.

DETAILED DESCRIPTION

Figure 1:
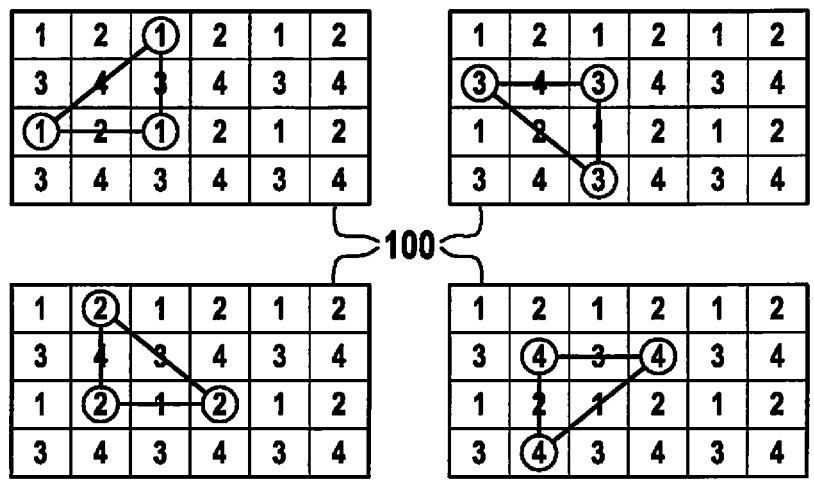
FIG. 1 shows a schematic representation of sampling values required for correct reconstruction, in an array.

In the following description of advantageous exemplary embodiments of the present invention, identical or similar reference characters are used for the elements shown in the various Figures having similar functions, and repeated description of these elements is omitted.

Typically, modern image sensors are made up of an orthogonal grid of individual sensor cells that, depending on the application, are equipped with or without a color filter array, or CFA, for the separation of different spectral channels.

Exceptions are three-dimensional integrated sensors that have vertically configured receiver elements, also called a "Foveon"-like structure according to the manufacturer.

For the reconstruction of a sampled signal, the evaluation of a plurality of sampling points is required.

In a standard color sensor, a macrocell of n elementary cells is standardly formed that are configured repetitively in an array. The number n of channels of this macrocell determines the maximum number of different light properties that can be sampled.

Because the typical array shape is the orthogonal grid, when there is an odd number of light properties one or more elements are doubled.

For a standard Bayer pattern, channels 1 to 4 are assigned for example as follows:
1=red
2=green
3=green
4=blue Other known color systems are:
1=cyan
2=yellow
3=yellow
4=magenta
or
1=red
2=clear (spectrally broadband open pass filter)
3=NIR (near infrared)
4=green In order to produce a sampling that permits a loss-free reconstruction of the continuous original signal, at least two sampling points per sampled property should be included in each sampling space direction.

The sampling space of a sensor array extends over the local frequency in each of the two array dimensions and in the time dimension.

The minimum sampleable local frequency is thus twice the minimum distance of two cells that sample the same signal quantity; for example in FIG. 1 these are cells having the same number.

FIG. 1 shows a schematic representation of sampling values required for correct reconstruction, in an array 100.

Shown are various elementary triangles spanned by adjacent sensor cells of the same type.

Twice the diagonal pixel distance occurs as the greatest distance between centers. Thus, the minimum local frequency to be reconstructed without loss in each of the channels is given by four times the diagonal pixel distance.

Figure 2:
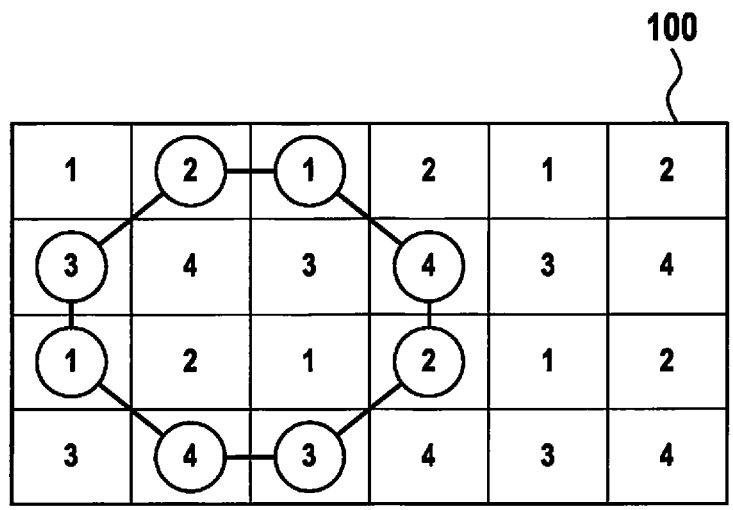
FIG. 2 shows a schematic representation of a minimal macrocell required for correct signal reconstruction, in the array of FIG. 1.

FIG. 2 shows a schematic representation of a minimum macrocell required for correct signal reconstruction in the array of FIG. 1.

Because the condition is supposed to be met for all light properties, in an orthogonal grid the shape of an octagon results whose corner points are occupied by the center point of, in each case, two elementary cells per channel. This is illustrated in FIG. 2.

In the design of the sensors, it is important to find a good compromise between light sensitivity, spatial resolution, the quality of the measurement of relevant light properties related to the application, transmission bandwidth, and cost.

For a given process, a high degree of light sensitivity is achieved by larger sensor cells. The spatial resolution can be increased by enlarged arrays, i.e. a larger number of sensor cells. The measurement of relevant light properties, such as color or polarization direction, is achieved through decomposition and reconstruction of the light properties that is as fine as possible and is well-matched to the application. Transmission bandwidth is essentially determined by the number of items of information transmitted by the sensor for post-processing, typically 12 bits per pixel. The cost is decisively influenced by the overall surface of the sensor, related in each case to a particular level of technology.

The approach described in the following provides the possibility of sampling up to five light features at the same resolution, and, depending on the individual case, using a scalable controlling to change them in order to achieve a higher reconstruction quality or higher resolution.

In addition, an optional in situ information compression makes it possible to reduce the data bandwidth at the output to the minimum necessary dimension, so that the compression of the data is transformed from a pixel grid to an information grid adapted to the information content.

The approach described in the following makes it possible for example to produce a high-resolution intensity image or grayscale image having an equally high-resolution measurement of the above-named light properties.

In order to achieve this at a dedicated optical resolution, i.e. given a circle of confusion resulting from the design of the optics, it is advantageous to deploy the sensor pixels symmetrically in a sensor cell for each light property to be acquired.

Figure 3:
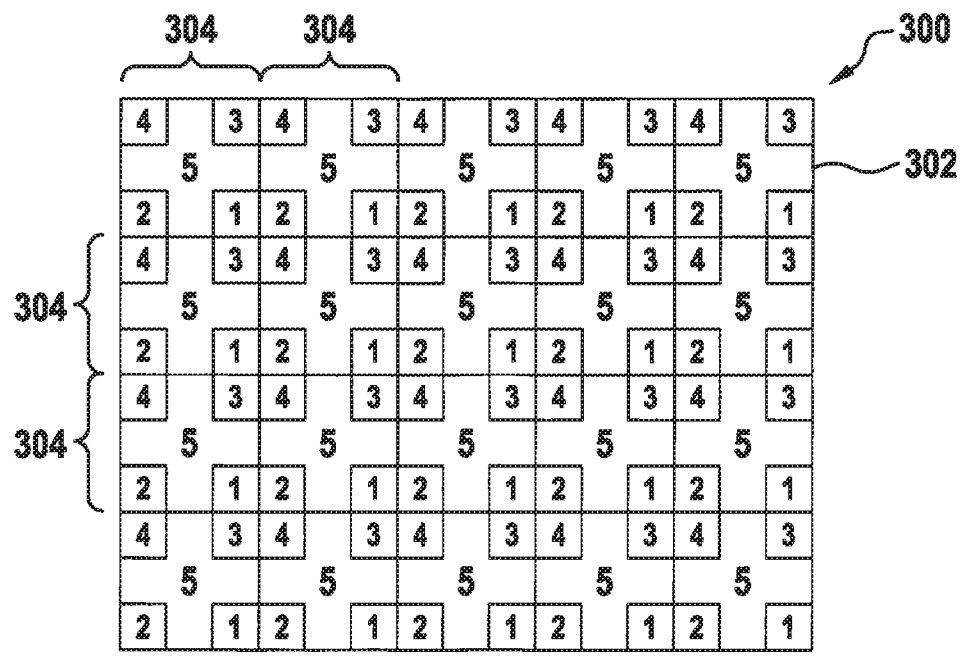
FIG. 3 shows a schematic representation of a light sensor module according to an exemplary embodiment of the present invention.

FIG. 3 shows a schematic representation of a light sensor module 300 according to an exemplary embodiment. Light sensor module 300 includes a sensor layer 302 having a plurality of sensor cells 304, each having five sensor pixels 1, 2, 3, 4, 5, each for acquiring a different light property. Sensor pixels 1, 2, 3, 4, 5 are configured in columns and rows one over the other or alongside one another, the reference characters 1 through 5 each representing one measurement channel. FIG. 3 shows a configuration for a five-channel sampling. According to an exemplary embodiment, sensor pixels 1, 2, 3, 4, 5 are also designated sensor cells.

According to this exemplary embodiment, sensor pixels 5 are realized as cross-shaped main pixels that respectively divide sensor cells 304 into four quadrants, here essentially of equal size. The four remaining sensor pixels 1, 2, 3, 4 are each realized as an additional pixel having a significantly smaller sensor surface than does main pixel 5. Each of the additional pixels 1, 2, 3, 4 is situated in one of the quadrants of sensor cells 304, so that a symmetrical configuration of additional pixels 1, 2, 3, 4 around main pixels 5 results. Main pixels 5 are for example designed to acquire a brightness.

The five sensor pixels of each sensor cell 304 are each realized as a different light sensor type.

Sensor types that may be used to acquire the various light properties are, for example for the measurement of the energy per light color (more than 10 types), visible CFA for cyan magenta yellow, R, G, B, clear, or non-visible xFA for NIR, FIR, UV, or specific bandpass properties (chlorophyll characteristics), and, for the measurement of the polarization in four degrees of polarization freedom (see Stokes-Jones vectors in two implementations), interference filters (hor, vert, diag-left, diag-right) or wavelength microstructures (metal grids, TiOx films, etc.). For the acquisition of the intensity over a high dynamic range with a plurality of transfer characteristics, the split pixel approach is suitable (large diode and small diode having a break point), DCG pixels (dual or multiple conversion gain with a plurality of break points), or log pixels (photovoltaic mode with precise logarithmic behavior). A time intensity curve (two types of implementation for temporal samplings independent of the frame time) can take place using pulsed light measure pixels (PWM gated integration) or array phase shifted readout scheme (temporal derivation of temporally delayed sampling processes of cells that are adjacent or are woven together).

From the permutation of the above-named possibilities, several thousand possible variations result. The approach proposed here enables the acquisition of five local parameters and, given suitable controlling, two temporal parameters.

A particularly advantageous reading out of macrocells or super cells takes place in such a way that all sensor pixels of the macrocell or of the super cell, or the signals thereof, are read out simultaneously or quasi-simultaneously. These signals can be further processed in a reconstruction unit or in a connective network without buffering. In this way, the need for memory capacity for the signal reconstruction can be significantly reduced.

In order to completely or partially circumvent a buffering, parallel communication is required between the sensor array and the analog or digital signal preparation unit.

The depicted number of four additional pixels 1, 2, 3, 4 has been chosen as an example. According to alternative exemplary embodiments, at least one additional pixel 1, 2, 3, 4 and, generally, any suitable number of additional pixels 1, 2, 3, 4, may be used.

Figure 4:
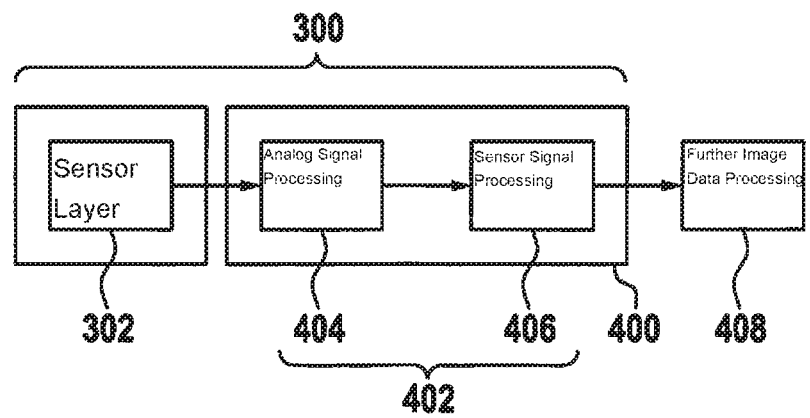
FIG. 4 shows a schematic representation of an example of a signal processing chain in a light sensor module according to an exemplary embodiment.

FIG. 4 shows a schematic representation of an example of a signal processing chain in a light sensor module 300 according to an exemplary embodiment. Shown are the sensor layer 302, for example a sensor array of n×m elementary cells, as well as a signal processing layer 400 having a signal processing unit 402 made up of a first block 404 for analog signal processing and analog-digital conversion and a second block 406 for sensor signal processing at i×k elements of a macrocell. In a third block 408, the further image data processing takes place outside light sensor module 300. Signal processing device 400, also called an information-compressing unit, is connected in electrically conductive fashion to sensor layer 302, as described in more detail below.

A partitioning as indicated in FIG. 4 can be realized in particular in a stacked die technology.

Figure 5:
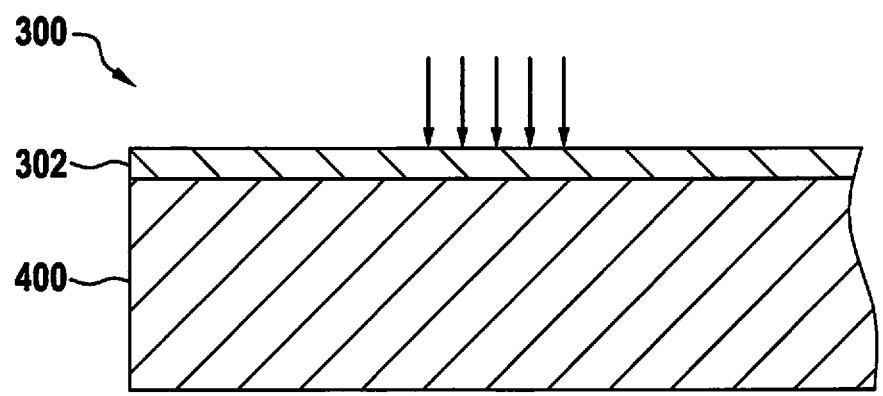
FIG. 5 shows a schematic representation of a cross-section through a light sensor module according to an exemplary embodiment.

FIG. 5 shows a schematic representation of a cross-section through a light sensor module 300 according to an exemplary embodiment, such as a light sensor module as described above on the basis of FIGS. 3 and 4. Shown are sensor layer 302 and signal processing layer 400, which are combined with one another to form a layer composite via an interface having for example several thousand connections.

The connection between the two circuit parts, in the form of sensor layer 302 and signal processing layer 400 for analog and digital signal preparation, takes place for example by wafer bonding. In particular, it is advantageous if there is a plurality of read lines per array column that make it possible to conduct all sampled light properties acquired along a column separately as well to the signal recombination unit in the sensor signal preparation.

Figure 6:
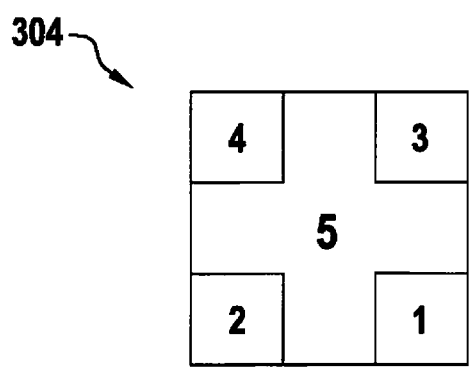
FIG. 6 shows a schematic representation of a macro sensor cell of FIG. 3.

FIG. 6 shows a schematic representation of a sensor cell 304 of FIG. 3. Sensor cell 304 is realized as a minimal five-channel macrocell.

Figure 7:
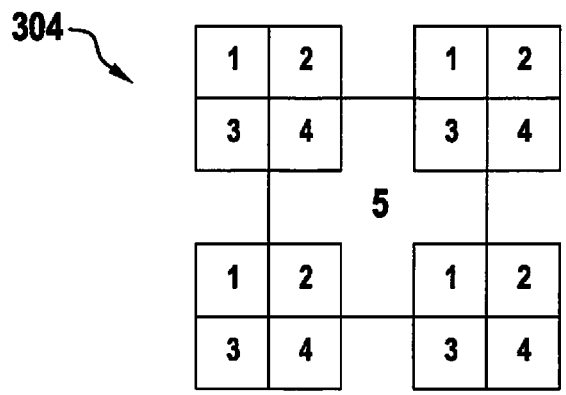
FIG. 7 shows a schematic representation of a super sensor cell according to an exemplary embodiment.

FIG. 7 shows a schematic view of a sensor cell 304 according to an exemplary embodiment. Differing from FIG. 6, here sensor cell 304 is realized as an optimal five-channel macrocell. Shown are two rows having n addressable elements (3 and 4), one row having n/2 addressable elements (5), and two rows having n addressable elements (1 and 2).

Through suitable design of a control circuit of the signal processing unit, the following advantageous addressing modes are possible.

According to an exemplary embodiment, channel 5 is designed as a luminance channel, channels 1 through 4 enabling a further ascertaining of the luminance, for example from the combination of three color cells with one clear pixel or of two color channels with two clear pixels. Depending on the distribution of the surfaces in the sensor cell, central channel 5 can be designed as a sensor pixel that is five to ten times more sensitive. According to an exemplary embodiment, main pixel 5 has a surface that is approximately five times as large as the additional pixels placed in the corners.

According to a further exemplary embodiment, additional pixels 1 through 4 are realized as split pixels of main pixel 5, recharged with main pixel 5 for example after being separately read out via a floating diffusion.

The sensor signal resulting from this analog interconnection averages all the signal charges contained in the macropixel, and thus yields a particularly low-noise signal.

The option of interconnection can be used for example to abandon the processing of some light features in favor of increased sensitivity when there is a weak signal in additional pixels 1 through 4.

Figure 8:
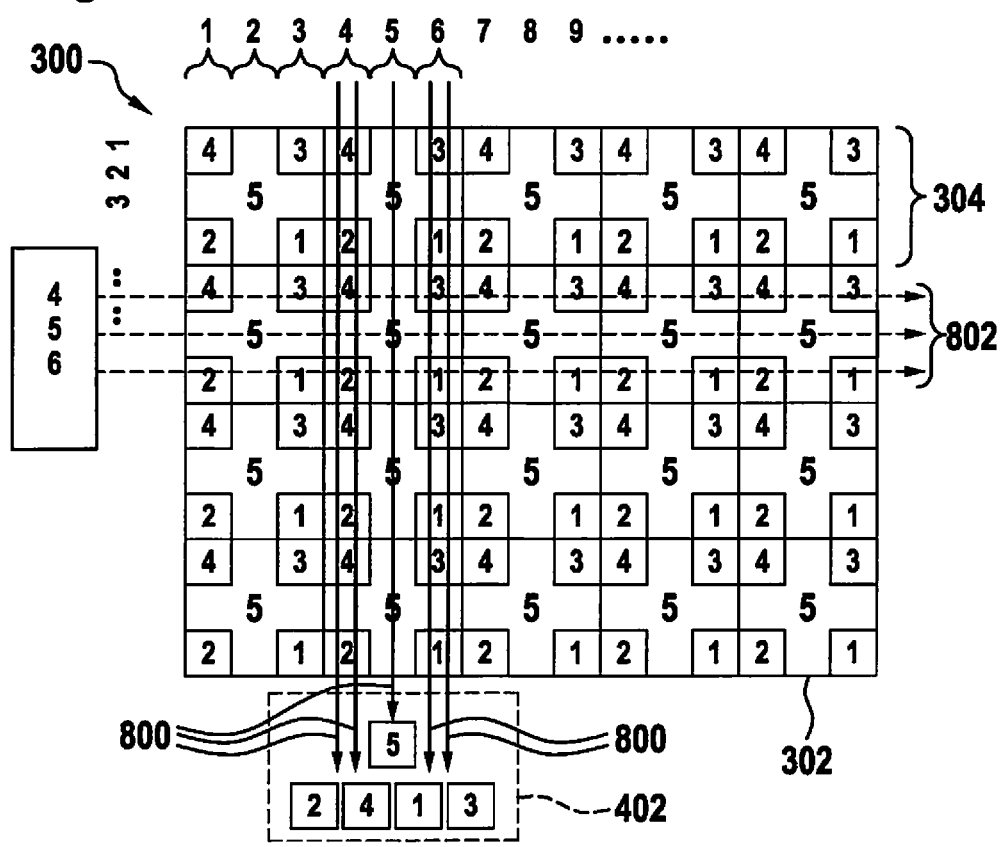
FIG. 8 shows a schematic representation of a light sensor module according to an exemplary embodiment.

FIG. 8 shows a schematic view of a light sensor module 300, for example a light sensor module described above on the basis of FIGS. 3 through 7. Shown is an addressing schema for a five-channel configuration. As can be seen in FIG. 8, the individual sensor pixels of sensor cells 304 are configured in a plurality of numbered rows and columns. Here, the sensor pixels of each column are electrically contacted via at least one read line 800 assigned to a respective light property of the sensor pixels. For clarity, in FIG. 8 only five read lines 800 are shown, for reading out the five channels of each of the sensor cells 304 situated one over the other in a column.

Analogously, the individual sensor pixels of each row are electrically contacted via a respective selection line 802. Selection lines 802 and read lines 800 are connected to the signal processing unit, which is designed to select the sensor pixels row-by-row via selection lines 802 and to read out and to process the respective sensor signals of the selected sensor pixels via the corresponding read lines 800.

The addressing of the minimal macrocells is done for example in such a way that an immediate processing of the sensor signals without buffering takes place.

For example, selection lines 802 of rows 4, 5, 6 are selected simultaneously by the signal processing unit, whereupon all addressed sensor cells 304 (for clarity, in FIG. 8 only a block of three rows is shown as an example, designated by reference character 304) of these rows drive their respective read line 800. If two read lines 800 are available per odd column, then, via five read lines 800 respectively, the five values of a minimal macrocell are transported into the signal processing unit, and are there combined to form a complex item of pixel information. Thus, for example from five 12-bit intensity signals a highly dynamic signal value adapted to the application can be produced having a 12-bit luminance signal, a 16-bit color signal, and a 2-bit modulation or polarization value. This has the advantage of a higher usable signal content with lower transmission bandwidth at the chip output.

An optional post-processing unit is for example designed to carry out a separate gain adjustment or offset/gain correction per read channel.

Figure 9:
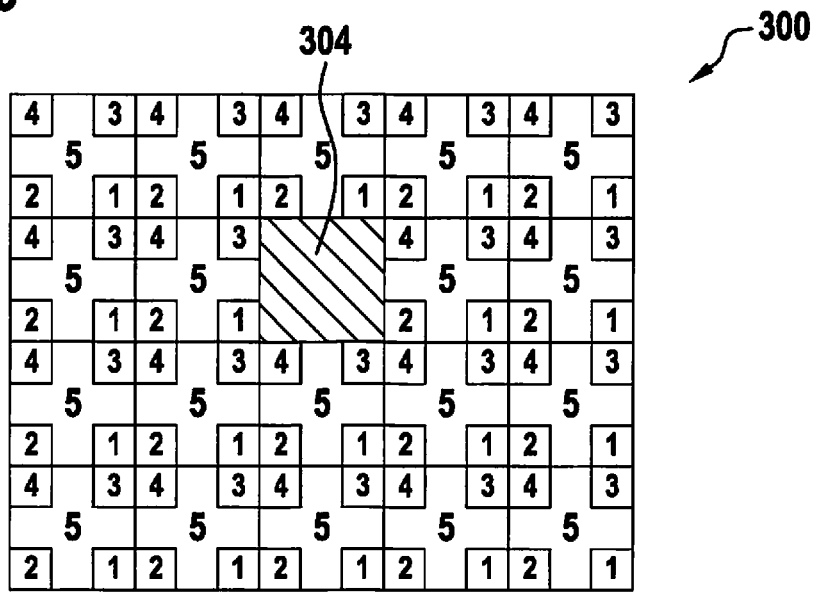
FIG. 9 shows a schematic representation of an addressed macrocell according to an exemplary embodiment.

FIG. 9 shows a schematic representation of a light sensor module 300 or an addressed macrocell according to an exemplary embodiment. Light sensor module 300 corresponds substantially to the light sensor module described above in relation to FIG. 3. Shown is a light sensor module having an addressed minimal macrocell 304, also referred to as sensor cell above. According to an exemplary embodiment, the individual cells 1, 2, 3, 4, 5 are also designated sensor cells, the common addressing of the 5 cells is designated as a macrocell, and the interconnection of 17 cells is designated as a super cell, also referred to as an optimal cell.

Figure 10:
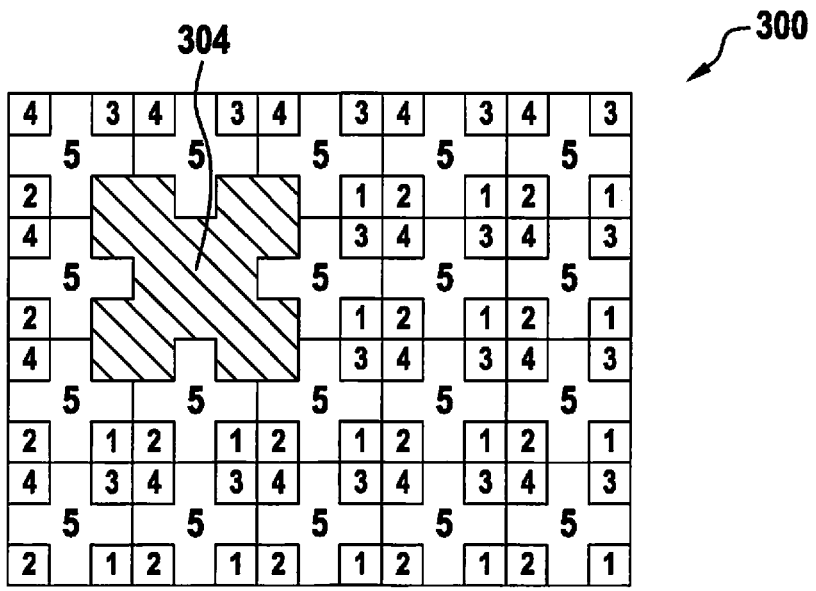
FIG. 10 shows a schematic representation of an addressed super cell according to an exemplary embodiment.

FIG. 10 shows a schematic representation of a light sensor module 300 or an addressed microcell according to an exemplary embodiment. Differing from FIG. 9, here the addressing of an optimal five-channel macrocell 304 is shown. Macrocell 304 is also referred to as a super cell, meaning that up to 17 individual cells are taken into account. This addressing is somewhat more expensive, but permits the full reconstruction of four property channels and one luminance channel with a minimal circle of confusion. FIG. 10 shows the addressing pattern of an optimal macrocell as shown for example in FIG. 7. In this mode, the sensor cells are to be read out either without destruction of charge, or the digitized signal for three rows is to be buffered in order to then enable an ideal reconstruction from 17 sampled values for each macropixel.

Figure 11:
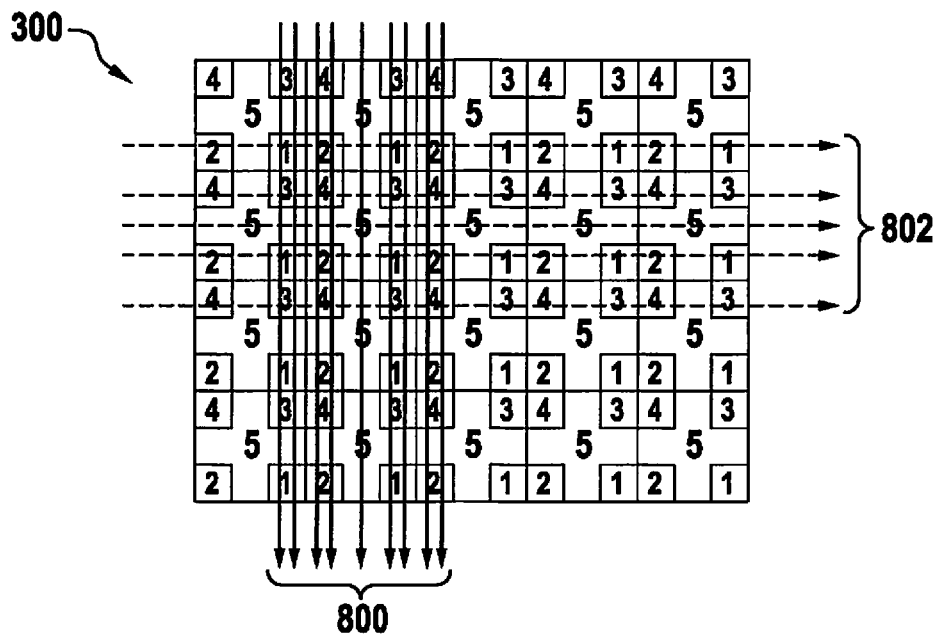
FIG. 11 shows a schematic representation of an addressing schema for the simultaneous addressing of a super cell according to an exemplary embodiment.

The addressing schema required for this is shown in FIG. 11.

FIG. 11 shows a schematic representation of a light sensor module 300 or an addressing schema for addressing of a super cell having overlapping addressing of the satellite cells, according to an exemplary embodiment. Differing from FIG. 8, the addressing schema shown in FIG. 11 for a five-channel configuration includes five selection lines 802 having a low input load, and 2×8 read lines 800. For better clarity, not all read lines 800 are shown.

In this addressing, rows of the same type are already mixed on the read line, because only one read line is available per column and cell type. This results in an efficient structure, but provides limited post-processing capability.

Figure 12:
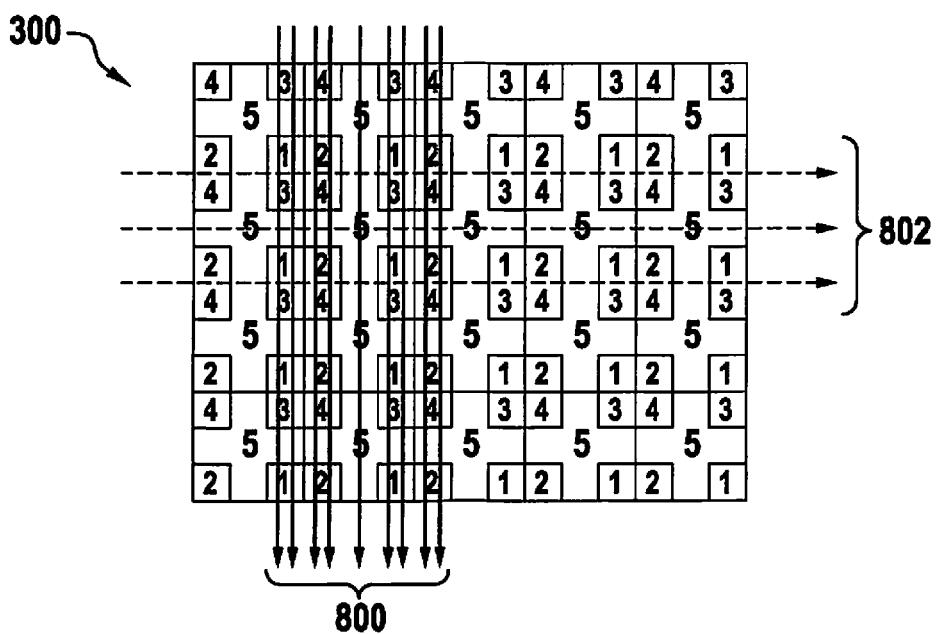
FIG. 12 shows a schematic representation of an addressing scheme for an addressing of a supercell with overlapping addressing of the satellite cells according to an exemplary embodiment.

FIG. 12 shows a schematic representation of a light sensor module 300 according to an exemplary embodiment. Differing from FIG. 11, FIG. 12 shows an addressing schema for a five-channel configuration having three selection lines 802, each of which addresses a cluster of four.

Figure 13:
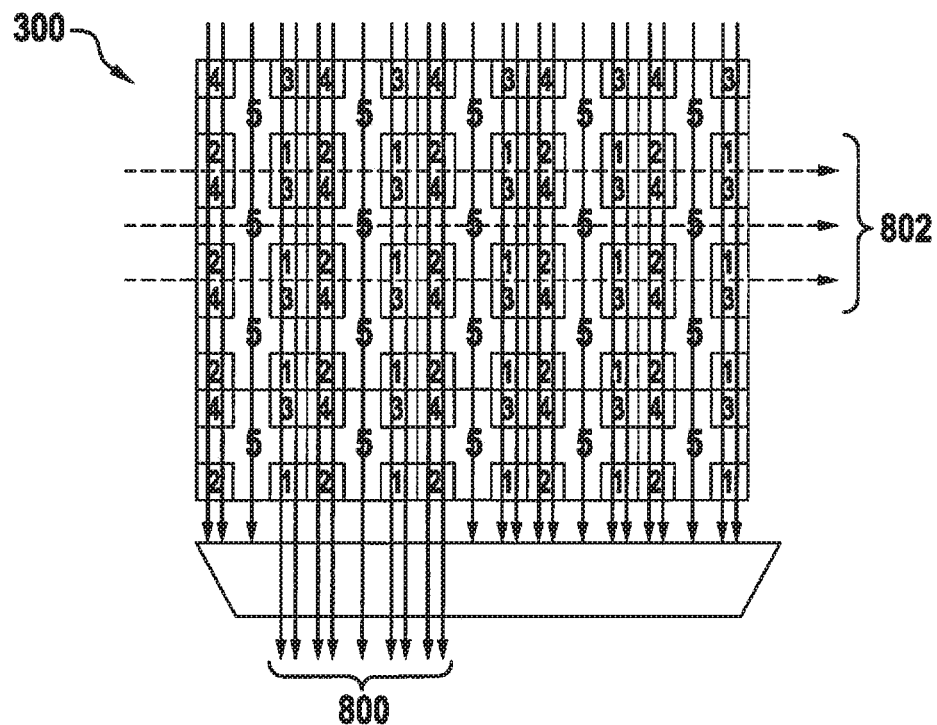
FIG. 13 shows a schematic reputation of a light sensor module according to an exemplary embodiment.

FIG. 13 shows a schematic representation of a light sensor module 300 according to an exemplary embodiment. Here, for example 17 read lines 800, of n read lines 800, are evaluated at a time TO. The selection lines 802 addressed at time TO select in parallel the additional pixels 1, 2, 3, 4 of the respective sensor cells.

Figure 14:
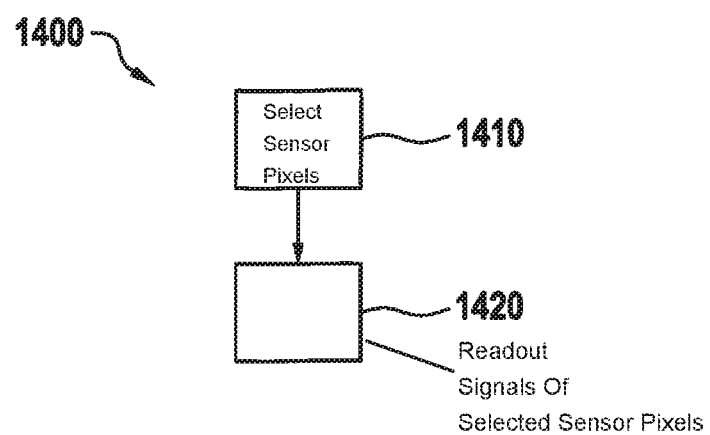
FIG. 14 shows a flow diagram of a method for operating a light sensor module according to an exemplary embodiment.

FIG. 14 shows a flow diagram of a method 1400 according to an exemplary embodiment. Method 1400 for operating a light sensor module, for example a light sensor module described above on the basis of FIGS. 3 through 13, can for example be carried out using a signal processing unit described above on the basis of FIGS. 4 through 13. Here, in a step 1410, the sensor pixels of the sensor cells configured in columns and rows can be selected row-by-row via one or more selection lines. In a step 1420, in response to the selection in step 1410, the sensor signals of the selected sensor pixels can be read out via one or more read lines by which the selected sensor pixels are connected to one another column-by-column. According to an exemplary embodiment, the sensor signals of different sensor pixels, in particular the sensor pixels of a macrocell or super cell, can here be read out essentially simultaneously.

Figure 15:
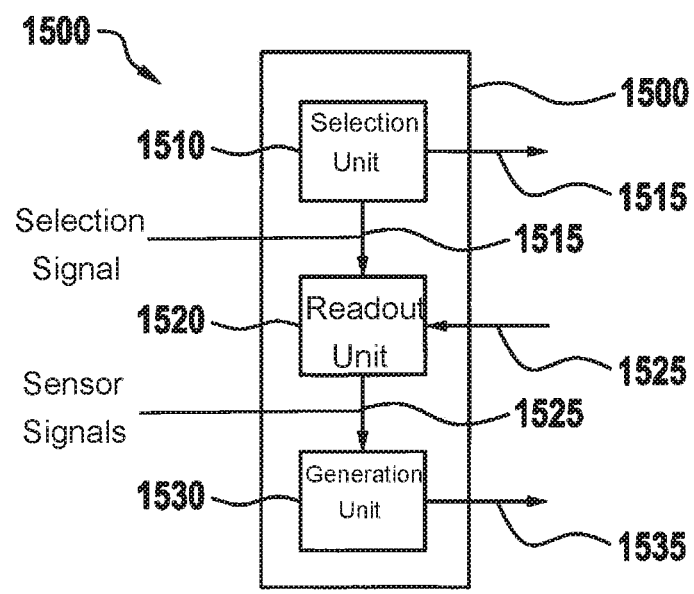
FIG. 15 shows a schematic representation of a device according to an exemplary embodiment.

FIG. 15 shows a schematic representation of a device 1500 according to an exemplary embodiment. For example, the signal processing unit described above on the basis of FIGS. 4 through 14 can be a component of device 1500. Device 1500 includes a selection unit 1510 that is designed to select row-by-row, via the corresponding selection lines, the sensor pixels of the light sensor module that are to be read out, by outputting a corresponding selection signal 1515. A readout unit 1520 is designed to, in response to the selection, read out the respective sensor signals 1525 of the selected sensor pixels via the corresponding read lines. An optional generation unit 1530 is designed to generate an image signal 1535 using sensor signals 1525, without buffering sensor signals 1525.

Figure 16:
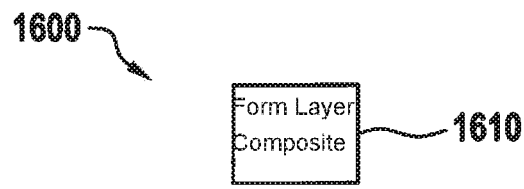
FIG. 16 shows a flow diagram of a method for producing a light sensor module according to an exemplary embodiment.

FIG. 16 shows a flow diagram of a method 1600 according to an exemplary embodiment. Method 1600 for producing a light sensor module, for example a light sensor module described above on the basis of FIGS. 3 through 15, includes a step 1610, in which a layer composite is formed, for example in stacked-die technology, from the sensor layer having the sensor cells and the signal processing layer having the signal processing unit. Here, the sensor pixels of the sensor cells of the sensor layer are configured in columns and rows relative to one another. In addition, the sensor pixels of each column are connected to the signal processing unit in electrically conductive fashion via at least one read line each associated to a different light property, and the sensor pixels of each row are connected to the signal processing unit in electrically conductive fashion via at least one selection line.

In the following, various exemplary embodiments of the approach presented here are described again in other words.

One of the additional pixels 1 through 4 has for example a pole filter that is inclined diagonally to the right. This configuration makes it possible to screen out polarized light parallel to a roadway surface or parallel to a perpendicular building façade.

According to another exemplary embodiment, one of the sensor pixels is realized as an analog local cell storage capacitor. In this way, a dynamic range of one of the signals can be increased.

One of the sensor pixels can be designed to forward signals from adjacent sensor pixels.

The signal processing unit is for example designed to read out the additional pixels 1 through 4 in time-shifted fashion relative to main pixels 5. The time shifting is used for example to determine the modulation of a "world illumination." For this purpose, the difference of the reconstructed luminance signals from the two temporally offset sample times is used.

Optionally, the signal processing unit is designed to adjust a phase displacement between the arrays of the main pixel 5 and the additional pixels 1 through 4 in a manner adapted to the situation, for example in order to reduce the effect of modulated illumination (mains frequency 50/60 Hz).

The approach described here has the following advantages.

The detection of different light properties such as luminance, color, or other non-visible spectral channels or polarization takes place temporally in parallel and locally symmetrically about a large and sensitive luminance sensor point as main pixel 5, and can be assigned thereto. In this way, up to five features can be acquired with one sensor cell.

Through suitable combination of the light features, for example in an upstream programmable connective network for processing simple, macro, and super cell items of information, the quantity of data transmitted by a high-resolution sensor cell to the signal processing unit, such as a downstream computer vision processing device, can be reduced.

The detection of the light properties is for example measured symmetrically to the intensity signal, and can be assigned to the central intensity value, for example as light component. Here, given suitable evaluation, the spectral distribution can be obtained from two to four band-limited spectral channels in relation to the broadband signal.

Through suitable distribution of on-chip-structured, pixel-selective polarization filters, the light feature polarization can in particular be extracted from the broadband sensitive sensor pixels, and a polarization map of the surrounding environment can be created. This is particularly advantageous for the recognition of polarizing surfaces, such as a wet roadway surface.

The condensation, or weighting and reduction, described on the basis of FIG. 4 of measurement data of various light signal properties is appropriate if the data rate of the following transmission channel is limited.

Standardly, the data rate of the digital-analog conversion would correspond to the property signal multiplied by the number of light sensors. However, it is now possible to store some light properties in compressed fashion for particular applications, and thus to transform a plurality of light sensor measurements into one sampling point of the light signal.

Here it is for example possible to compress the light intensity in a signal-to-noise ratio that is constant from the point of view of information theory.

However, it is also possible to code the color information from three light sensors of different 12-bit spectral channels into two channels that are each 8 bits in width.

Depending on the signal quality and application-specific requirements, in this way it is possible to significantly compress the bandwidth close to the sensor, using simple computing operations.

Further exemplary embodiments include, inter alia, the use of a logarithmic light sensor to set the exposure time of the linear light sensors and the calculation of the Jones or Stokes parameters in a low bit resolution from some polarization sensors, the calculation of specific spectral channels, such as chlorophyll detection for vegetation-specific feature extraction (a few bits can suffice, for example two to three bits for up to ten recognition stages of the vegetation), the calculation of infrared and UV channels, and the calculation of color.

The core idea here remains the reduction of the data rate as close to the sensor as possible, taking into account the application requirements and the information content of the various light property sensors. Here, the data rate per pixel is reduced for example from 3×12 bits for RGGB to 12+8+8 bits at intensity and u, v, and also in the quantity of pixels required to reflect the spatially resolved information [sic].

For this purpose, light sensor module 300 is realized as follows, according to the exemplary embodiment.

The light sensor module, also called image sensor array, has a multiplicity of individual sensor elements, also called sensor pixels above, that are designed to measure various light features. For example, the light sensor module is realized as a five-channel array having four sensor pixels configured symmetrically around a luminance channel. Here, for example smaller sensor pixels are embedded between larger sensor pixels. The sensor pixels can be addressed separately or simultaneously with a central sensor pixel. The sensor pixels can have differently realized pixel transfer characteristics. For example, the larger sensor pixels, for example for intensity measurement, are designed logarithmically or quasi-logarithmically, and the smaller sensor pixels, for example for color measurement, are designed to be linear, or vice versa. The macropixel data can be read out in parallel for immediate processing without buffering. In particular, the light sensor module is realized in stacked-die technology in order to enable an immediate processing of sensor signals of the individual sensor pixels to form a compressed item of complex information, e.g. pixels having a 12-bit item of brightness information, a 14-bit item of color information, 2-bit polarization information, 3-bit infrared or UV portion, and a 1-bit modulation index, with equal optical local resolution for the luminance and other optical properties.

The approach presented here thus enables a scalable resolution controlling and locus-resolved acquisition of a wide variety of light properties via a corresponding configuration of sensor cells 304 and a corresponding signal preparation for a sampling, appropriate for the reconstruction, of the light properties, such as photon energy, in the form of different wavelengths or colors, polarization, linear and logarithmic intensity (over a dynamic scope of more than six decades), or a temporal intensity curve. Signal processing unit 402 is here in particular also used for information compression.

Here, a distribution of the sampling points is selected such that, given an optical circle of confusion that is as small as possible, a sampling of a plurality of light properties is possible that can be assigned to one output pixel.

In addition, the approach described here enables a variable addressing of macropixels 304, also referred to as macrocells or super cells above, for the processing of signal groups having different optimization goals such as sampling-conformal reconstruction of a high-resolution luminance signal or a plurality of optical properties.

Through the approach described here, for example a sensor for machine vision intended to meet the requirements relating to spatial resolution can be realized particularly efficiently with regard to surface, bandwidth, and manufacturing expense.

Figure 17:
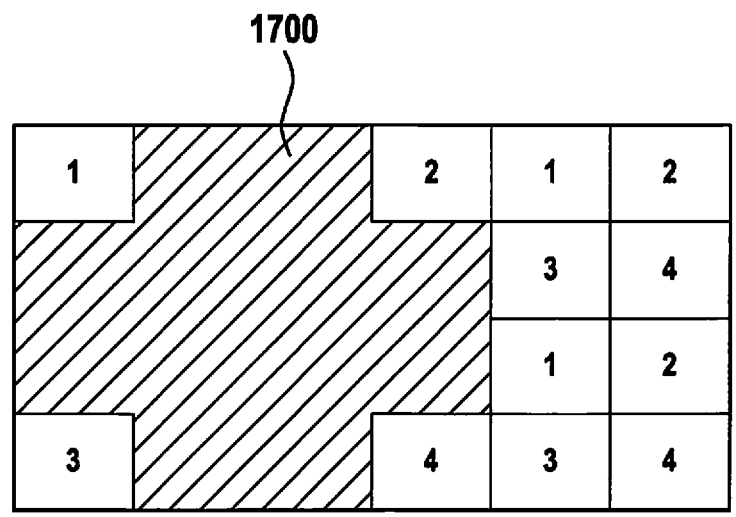
FIG. 17 shows a schematic representation of a minimal filter core in a regular four-channel array.

FIG. 17 shows a schematic representation of a minimal filter core 1700 and a regular four-channel array for a correct sampling of a four-channel array configuration having extension 4r.

Figure 18:
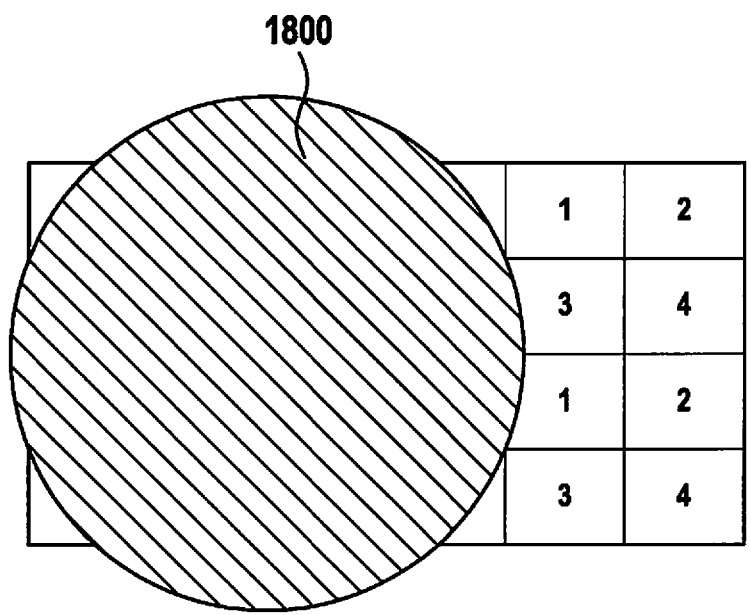
FIG. 18 shows a schematic representation of a minimal circle of confusion.

FIG. 18 shows a schematic representation of a minimal circle of confusion 1800 of an imaging optical system with which the sampling condition can be met for all channels.

FIGS. 17 and 18 show (unfavorable) conditions in systems not provided by the present invention. The use of the structure described in accordance with the approach described herein results in similar or better quality with a smaller overall surface.

In the following, further examples of sensor addressing structures and methods are described, and a variable combination of groups of sensor pixels is achieved with different sensor grid configurations. This grouping and basis post-processing can be easily reconfigured during running operation, so that different sampling properties can be produced depending on the situation. For the sensor addressing and the adapted reading out, an image sensor is provided having controlling and signal preparation adaptable to the particular situation. Through the adaptation of the sampling behavior of the sensor, a compression of sampled individual signals can be carried out to form items of information that can be processed at low bandwidth in a subsequent computing device.

In particular, the addressing structures make it possible to interconnect sensor cells having different integration and readout phase groups, but also to interconnect sensor pixels from the same or different channels (cells having different items of light information, such as photon energy, polarization, integration phase position, . . . ) in order to improve the signal, or to assemble new complex items of information from the combination of the signals.

These new complex items of information are particular mixed items of information that can be transferred and processed in a post-processing stage, with low data bandwidth.

The realization of the addressing is here adapted to the underlying grid shape (orthogonal, hexagonal, triangular, rhombic) and the number of distinct sensor channels.

The interconnection of a plurality of sensor cells that are to be read out simultaneously can take place in different ways:

- in analog fashion in the sensor or macrocell (through addressable transfer gates that connect the sensor cells directly to one another)
- in analog fashion in the sensor or macrocell (through addressing of a transfer gate that enables charge transport from a sensor cell to a capacitor fed by a plurality of cells)
- on the read line (in that a switching transistor switches output amplifiers of the cell onto a common read line)
- in analog fashion, in a sample and hold stage
- digitally, in a digital computing device that takes signals of a macrocell as input and carries out a programmable/selectable computing operation.

The following sensor addressing structures and control/readout examples are described on the basis of a five-channel sensor 300. However, they can easily be transferred to other sensor types and designs.

The five-channel design 300 shown in FIG. 3 is a repetitive pattern of sensor cells that permits up to five individually differently designed sensor pixel types. As sensor pixel types, the following possibilities and combinations thereof are possible:

1. The large central sensor pixel (5 in FIG. 6 or FIG. 7) could for example be of the following type:
   a) HDR lin luminance=e.g. undivided PIN diode with large full wave b) split linear luminance=2 partial diodes separated by a switch, or 1 diode having a connected transfer capacitor
c) log luminance=cell in photovoltaic mode
d) lin/log luminance=diode having a switchable state (see NIT)
2. The peripheral "satellite sensor pixels," or additional pixels (1, 2, 3, 4 in FIG. 6 or FIG. 7) could be of the following type:
   a) RBGC: red, green, blue, clear
   b) RGCNir: red, green, clear near infrared
   c) RBCpolhCpolv: red, green, clear horizontally polarized, clear vertically polarized
   d) or any permutation of the above-named cell types or their derivates.

The sensor cell 304 shown in FIG. 6, which corresponds to a segment of the sensor configuration of the sensor shown in FIG. 3, is referred to as a macrocell. The sensor cell shown in FIG. 7 is designated a super cell. Both macrocells and super cells repeat regularly, when viewing the overall sensor configuration in FIG. 3. The macrocell has five different sensor pixels. The super cell is made up of a total of 17 sensor pixels. If the sensor pixels are designed such that they permit a reconstruction of the property of cell 5 situated in the center, for example an item of brightness information, then a sampling-conformal reconstruction of local frequencies down to 1.5 times the macrocell size is achieved.

Various addressing types are possible for reading out the five-channel sensor 300.

Figure 19:
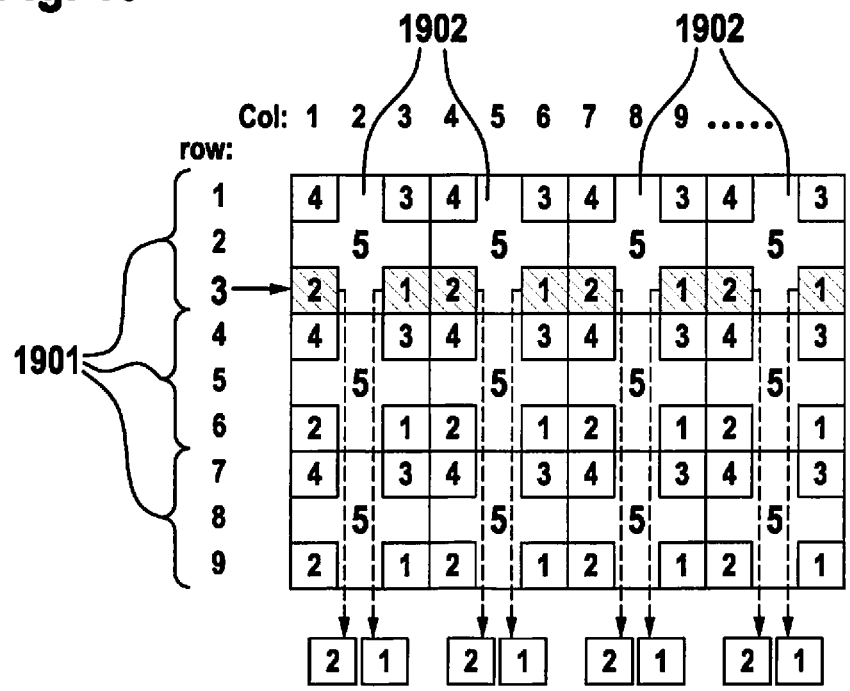
FIG. 19 shows a read-out schema of the light sensor module.

FIG. 19 shows an addressing scheme in which each macrocell is acquired successively/in temporally offset fashion by, in each case, three address lines 1901, which vertically address three sub-regions of the macrocell. For the uppermost macrocells 1902, these are correspondingly the uppermost three rows. The simplest addressing is the linearly progressive addressing, which in this example acquires two cell types or one cell type.

The number of addressed sensor pixels varies depending on the zone. Rows 1 and 3 each address twice as many sensor pixels as row 2. The pattern repeats itself in each case after 3 rows, i.e. modulo 3.

After the reading out of three rows, the calculation of a combination of the five contributions of a macrocell can be started. After five rows, the calculation of the complex values can be extended to the environment around the super cell. In this mode, one or two read lines are required per row and macrocell in temporally alternating fashion in order to transport the cell information into the signal preparation unit: two read lines for the rows 1, 3, 4, 6, 7, 9, . . . and one read line for the rows 2, 5, 8, . . . .

Figure 20:
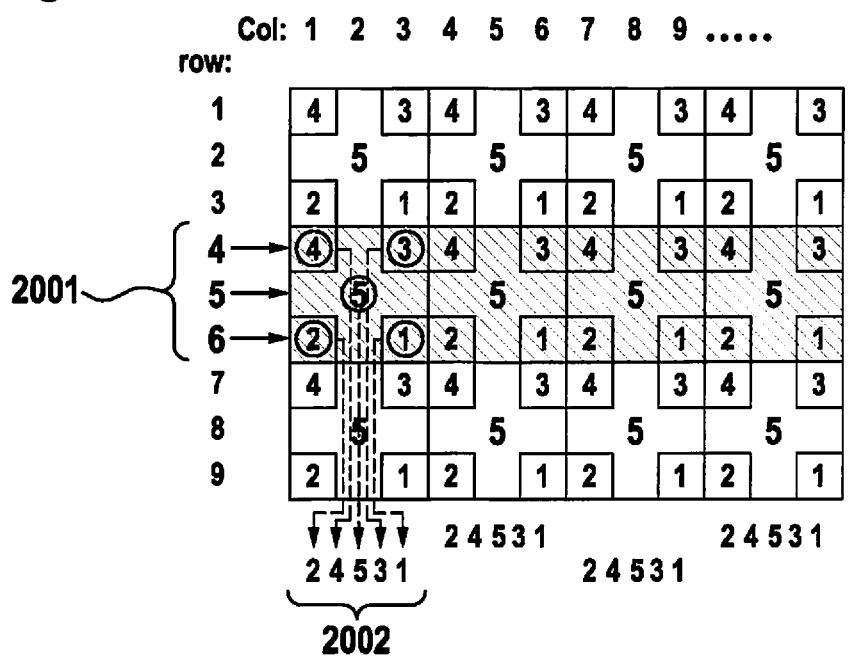
FIG. 20 shows another read-out schema of the light sensor module.

FIG. 20 shows a further addressing schema in which each macrocell is addressed simultaneously by three address lines 2001. Here, each of the address lines acquires one of the vertical three sub-regions of the macrocell, corresponding to rows 4 through 6 in FIG. 20.

The reading out takes place via five parallel read lines 2002 per macrocell, in order to make it possible to separate the cells 1, 2, 3, 4, 5 of a macrocell that are situated in a column. The addressing jumps modulo 3, by three rows in each case. The data of the five individual cells 1, 2, 3, 4, 5 of the macrocells is conducted to the signal preparation unit through five parallel lines 2002. The calculation of a combination of the five contributions of a macrocell can take place immediately, without buffering the read-out data.

Figure 21:
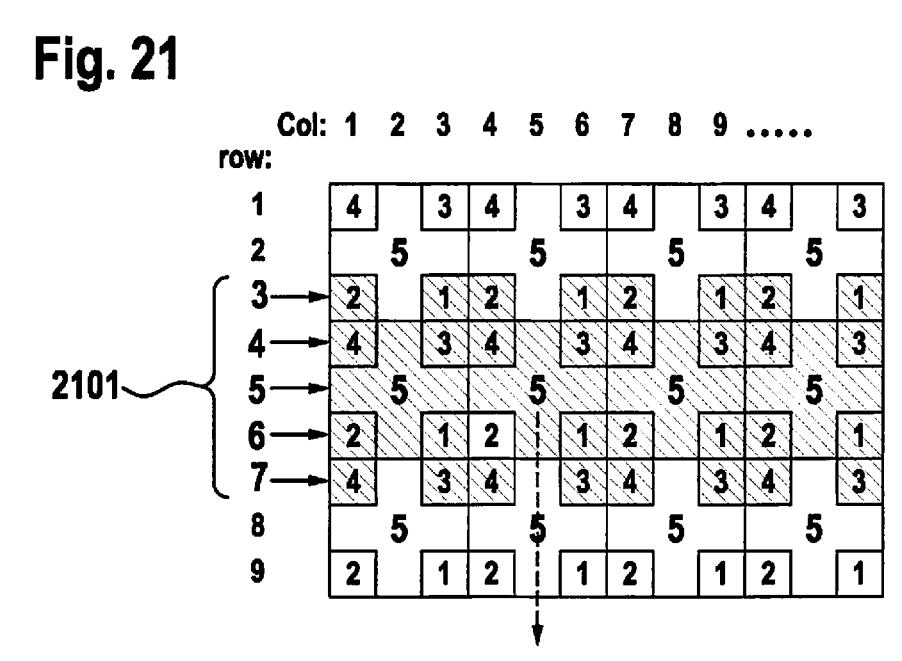

FIG. 21 shows a further addressing scheme in which each super cell is addressed simultaneously by five address lines 2101. Here, each address line acquires one of the five subregions/sensor pixels from a macrocell, and, respectively, two subregions/sensor pixels from the neighbor macrocells situated above and below. In FIG. 21, these are rows 3 through 7.

In the addressing, in each case three new address lines are activated and two already-addressed rows are retained. In FIG. 21, the addressing of the super cells is addressed around row 5 (2 rows respectively above and below row 5). In order to address the closest row having super cells, the selection of rows 3 through 5 is omitted, and the addressing of rows 8 through 10 is added.

The values of a super cell are read out via nine read lines per super cell that readout the sensor pixels marked in black of the first three columns in the rows 3 through 7 (FIG. 21). For the calculation of supercell combinations, it is necessary in each case to include four lines of the two adjacent neighbor cells in the same rows. For this purpose, an additional structure is required for storage (digital signal) or buffering (for analog signals), in order to provide the overlapping signal portions to both cells. The calculation of the super cell contents takes place from the combination of the 17 contributions of the individual sensor pixels of a super cell.

FIG. 22 shows a further addressing schema in which defined pixel groups and/or cell combinations are read out with a time offset. Here, the overall image sensor, or all available sensor pixels, can be divided for example into two or more pixel groups or cell combinations. It is advantageous if the pixel groups or cell groups can acquire the same property of the detected radiation, e.g. a luminance value. This can be realized through a corresponding selection of the individual sensor pixels.

In this so-called addressing in the phase shift mode, the pixel groups or sensor cells combined in a phase are each reached by the addressing. Here it is advantageous to arrange respectively addressed pixel groups or sensor cells symmetrically. For this addressing schema, the five-channel sensor 300 is subdivided into two sensor cell groups, in this case "phase1" cells 2201 and "phase2" cells 2202, each marked in black in FIG. 22 *a*) and *b*).

Between the addressing of the "phase1" cells 2201 and the "phase2" cells 2202, there takes place for example a pulse shifting of address pulses by a programmable time $T_{delay}$ that can be e.g. in the range of a few row times (time for reading out a row) up to several hundred row times. In this way, signals are produced that cover the same macrocell area but were sampled at different times.

Because, depending on the design of the individual sensor pixels from the two sensor cell groups, e.g. a luminance signal can be ascertained, it is possible to produce a temporal derivative signal that is not a function of the frame rate of sensor 300, but rather of a delay element that defines the time $T_{delay}$ between the sampling of the "phase1" cells 2201 and the "phase2" cells 2202.

It is also possible to change the time $T_{delay}$ during the operation of sensor 300 so that different delays occur between the samplings of the "phase1" cells 2201 and of the "phase2" cells 2202. In this way, it can be ensured that for example pulsing light signs are recognized. In some cases it would not be possible to acquire these without the time-delayed sampling, due to the limited readout speeds of image sensor 300, or due to an unfavorable phase relation between the sensor sampling and the frequency of the light source.

Figures 23, 24:
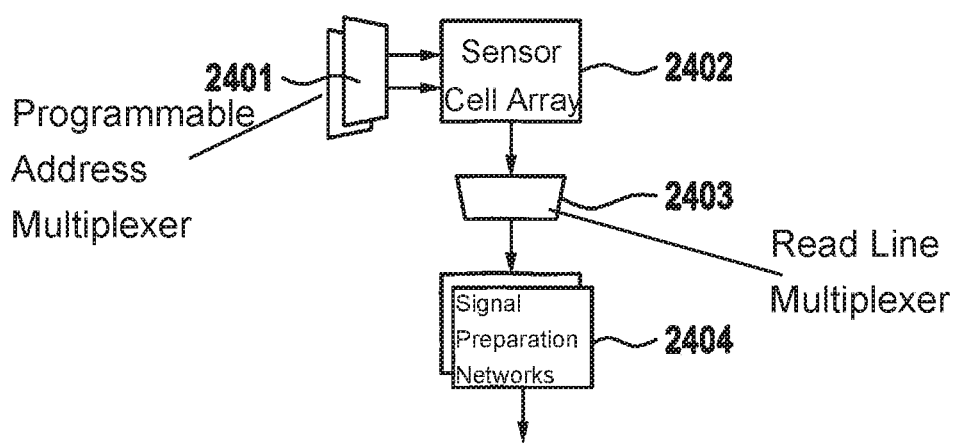
FIG. 23 shows another read-out schema of the light sensor module.
FIG. 24 shows a schematic design of a light sensor module assembly.

FIG. 23 shows another addressing schema in which the addressing lines of two or more sensor pixels are electrically connected to one another.

For this purpose, in FIG. 23 per macrocell in each case the address lines of the sensor pixels 5 [and] of sensor pixels 1 are connected to one another. The combined sensor pixels are designated split pixels, which in this exemplary embodiment are combined with individual sensor pixels and/or sensor cells. If these hardwired split pixels are disconnected from the addressing of the remaining row elements, then the split pixel elements, or the signals read out using the split pixels, can be combined, e.g. for highly dynamic sensor cells, together with simple cells and/or sensor pixels or the signals thereof.

FIG. 24 shows an example of a system with which the addressing schemas and readout schemas can be realized in hardware. The mechanical module of a camera shown here can preferably be realized using stacked die technology.

The design is based on an array of sensor cells 2402 addressed by a programmable address multiplexer 2401. Using programmable address multiplexer 2401, arbitrary sensor pixels or sensor cells can be selected from all the available sensor pixels, and addressed at different times. Both the addressed sensor pixels or sensor cells and also the times at which these are addressed can be varied and/or programmed in any manner desired. Using a read line multiplexer 2403, particular sensor pixels or sensor cells are read out at specified times and the read-out signals are distributed to an arbitrary number of signal preparation networks/signal preparation units 2404. These signal preparation networks 2404 can be programmable or trainable. A plurality of these signal preparation networks 2404 can also be provided with read-out signals/items of information one after the other or in parallel by read line multiplexer 2403. Using these signal preparation networks 2404, a processing of simple, macro, and super cell items of information is possible. Through these signal preparation networks 2404, it is possible to produce a temporally and/or spatially filtered signal, combined in a manner related to the application, with low bandwidth.

The multiplexers of addressing unit 2401 are preferably realized as chargeable shift registers. These can be loaded for example with a pattern that is then run through cyclically until a different addressing pattern is required and/or loaded. The addressing unit 2401 and signal preparation unit 2404 are controlled by a microcontroller that is also integrated and is not shown.

In signal preparation units 2404, mixed items of information can also already be processed and produced, for example integrated mixed signals from individual channels, such as (luminance)+(pole-filtered luminance) or
(luminance)−(pole-filtered luminance) or
(luminance in the transparent channel (sensor pixel 5 in FIG. 6))−(ascertained luminance from the sum of a plurality of spectral channels (sensor pixels 1, 2, 3, 4 in FIG. 6)).

The use of the described addressing and readout schemas results in a number of advantages. Base signals that can be produced in large number and with a high sampling rate can be compressed in a manner adapted to the situation and immediately in the sensor, so that the information content can be adapted to the respective situation and recognition task, and the data rate for the post-processing unit can be reduced. In addition, a temporal and local low-pass filtering of sampled signals is possible. In addition, using the schema and the associated design, combination signals can be produced that have greater relevance for a subsequent classification process. The presented design moreover contains "programmable, trainable, or learning" elements in signal preparation unit 2404 that are adapted to the preparation of signals of a macrocell or super cell.

A further significant advantage that results from the design and the addressing and readout schemas is the compression of information at the location of origin/in signal preparation unit 2404. In this way, the transmission rates can be significantly reduced.

What is claimed is:

1. A light sensor module, comprising:
a sensor layer having a plurality of sensor cells, wherein:
each of the sensor cells includes:
a respective main sensor pixel configured to sense one of a group of light properties; and
a respective plurality of satellite sensor pixels that (a) are each smaller than the main sensor pixel, (b) are arranged at a periphery of the main sensor pixel, and (c) are configured to sense one or more others of the group of light properties, different than the light property the respective main sensor pixel is configured to sense;
the group of light properties consists of three properties, the three properties being (1) luminance, (2) color, and (3) polarization; and
the sensor pixels are arranged in columns and rows;
a signal processing unit for processing sensor signals of the sensor pixels;
a plurality of electrically conductive read lines; and
a plurality of selection lines that each corresponds to a respective one of the rows;
wherein, for each of the columns, a plurality of the sensor pixels of the respective column that are at a same relative sensor cell position of different ones of the sensor cells are electrically connected via a respective one of the read lines to the signal processing unit, the signal processing unit being configured to select row-by-row, via respective ones of the selection lines, respective subsets of the plurality of the sensor pixels of the respective column that are to be read out via the respective one of the read lines.

2. The light sensor module as recited in claim 1, wherein the respective plurality of satellite sensor pixels includes four sensor pixels.

3. The light sensor module as recited in claim 2, wherein at least two of the four sensor pixels are arranged symmetrically around the main sensor pixel.

4. The light sensor module as recited in claim 2, wherein the four sensor pixels are arranged symmetrically around the main pixel.

5. The light sensor module as recited in claim 2, wherein the main pixel is formed as a cross dividing the sensor cell into four quadrants, respective ones of the four sensor pixels being situated in respective ones of the four quadrants.

6. The light sensor module as recited in claim 1, wherein the main sensor pixel is configured to sense the luminance.

7. The light sensor module as recited in claim 6, wherein the luminance is a broadband luminance.

8. The light sensor module as recited in claim 1, further comprising a signal processing layer in which the signal processing unit is situated in the signal processing layer and that is combined, as a layer composite, with the sensor layer.

9. The light sensor module as recited in claim 1, wherein at least one of:
at least one of the rows includes a larger number of the sensor pixels than does at least one other of the rows; and at least one of the column includes a larger number of the sensor pixels than does at least one other of the columns.

10. A method for operating a light sensor module that includes a sensor layer having a plurality of sensor cells, wherein each of the sensor cells includes a respective main sensor pixel configured to sense one of a group of light properties and a respective plurality of satellite sensor pixels that (a) are each smaller than the main sensor pixel, (b) are arranged at a periphery of the main sensor pixel, and (c) are configured to sense one or more other of the group of light properties, different than the light property the respective main sensor pixel is configured to sense, wherein the group of light properties consists of three properties, the three properties being (1) luminance, (2) color, and (3) polarization, and wherein the sensor pixels are arranged in columns and rows, the light sensor module further including a signal processing unit for processing sensor signals of the sensor pixels, a plurality of electrically conductive read lines, and a plurality of selection lines that each corresponds to a respective one of the rows, wherein, for each of the columns, a plurality of the sensor pixels of the respective column that are at a same relative sensor cell position of different ones of the sensor cells are electrically connected via a respective one of the read lines to the signal processing unit, the signal processing unit being configured to select row-by-row, via respective ones of the selection lines, respective subsets of the plurality of the sensor pixels of the respective column that are to be read out via the respective one of the read lines, the method comprising:
performing the row-by-row selection of the sensor pixels via the selection lines; and
reading out, via the read lines, sensor signals of the sensor pixels selected via the selection lines.

11. The method as recited in claim 10, wherein, for each of the sensor cells, all of the sensor pixels of the respective sensor cell are read out simultaneously in the step of reading out.

12. The method as recited in claim 10, further comprising:
generating an image signal using the sensor signals.

13. The method as recited in claim 12, wherein the image signal is generated without buffering of the sensor signals.

14. A method for producing a light sensor module, the method comprising:
forming a layer composite of a sensor layer and a signal processing layer;
arranging in the sensor layer a plurality of sensor cells, wherein:
each of the sensor cells includes:
a respective main sensor pixel configured to sense one of a group of light properties; and
a respective plurality of satellite sensor pixels that (a) are each smaller than the main sensor pixel, (b) are arranged at a periphery of the main sensor pixel, and (c) are configured to sense one or more others of the group of light properties, different than the light property the respective main sensor pixel is configured to sense;
the group of light properties consists of three properties, the three properties being (1) luminance, (2) color, and (3) polarization; and
the arranging of the plurality of sensor cells is such that the sensor pixels are arranged in columns and rows;
arranging in the signal processing layer a signal processing unit for processing sensor signals of the sensor pixels; and
providing an electrical interconnection network by which the sensor pixels are electrically connected to the signal processing unit, wherein:
the electrical interconnection network includes a plurality of electrically conductive read lines and a plurality of selection lines that each corresponds to a respective one of the rows; and
for each of the columns, a plurality of the sensor pixels of the respective column that are at a same relative sensor cell position of different ones of the sensor cells are electrically connected via a respective one of the read lines to the signal processing unit, the signal processing unit being configured to select row-by-row, via respective ones of the selection lines, respective subsets of the plurality of the sensor pixels of the respective column that are to be read out via the respective one of the read lines.

15. A device comprising a processor, wherein:
the processor is configured to operate a light sensor module that includes a plurality of sensor cells;
each of the sensor cells includes:
a respective main sensor pixel configured to sense one of a group of light properties; and
a respective plurality of satellite sensor pixels that (a) are each smaller than the main sensor pixel, (b) are arranged at a periphery of the main sensor pixel, and (c) are configured to sense one or more others of the group of light properties, different than the light property the respective main sensor pixel is configured to sense;
the group of light properties consists of three properties, the three properties being (1) luminance, (2) color, and (3) polarization;
the sensor pixels are arranged in columns and rows;
for each of the columns, respective sensor signals of a plurality of the sensor pixels of the respective column that are at a same relative sensor cell position of different ones of the sensor cells are transmittable to the processor via a respective one of the read lines;
for the operation of the light sensor module, the processor is configured to control a plurality of selection lines that each corresponds to a respective one of the rows to alternately select different subsets of the rows, by which selection the sensor signals of the sensor pixels of the respective rows are transferred over the read lines to the processor; and
the processor is configured to process the transferred sensor signals.

16. The device as recited in claim 15, wherein the processor is configured to generate an image based on the transferred sensor signals.

17. A non-transitory computer-readable medium on which are stored instructions that are executable by a processor and that, when executed by the processor, cause the processor to perform a method to operate a light sensor module that includes a plurality of sensor cells, wherein:
each of the sensor cells includes:
a respective main sensor pixel configured to sense one of a group of light properties; and
a respective plurality of satellite sensor pixels that (a) are each smaller than the main sensor pixel, (b) are arranged at a periphery of the main sensor pixel, and (c) are configured to sense one or more others of the group of light properties, different than the light property the respective main sensor pixel is configured to sense;

the group of light properties consists of three properties, the three properties being (1) luminance, (2) color, and (3) polarization;

the sensor pixels are arranged in columns and rows;

for each of the columns, respective sensor signals of a plurality of the sensor pixels of the respective column that are at a same relative sensor cell position of different ones of the sensor cells are transmittable to the processor via a respective one of the read lines; and the method includes controlling a plurality of selection lines that each corresponds to a respective one of the rows to alternately select different subsets of the rows, by which selection the sensor signals of the sensor pixels of the respective rows are transferred over the read lines to the processor.

* * * * *